United States Patent [19]
Edler et al.

[11] Patent Number: 5,606,565
[45] Date of Patent: Feb. 25, 1997

[54] METHOD OF APPLYING BOUNDARY TEST PATTERNS

[75] Inventors: Christopher L. Edler, Los Angeles; William D. Farwell, Thousand Oaks; Ian Herman, Hermosa Beach; Tuan M. Hoang, La Mirada; Brian F. Keish, Stanford; Alida G. Mascitelli, Thousand Oaks, all of Calif.

[73] Assignee: Hughes Electronics, Los Angeles, Calif.

[21] Appl. No.: 388,655

[22] Filed: Feb. 14, 1995

[51] Int. Cl.$^6$ .................................................. H04B 17/00
[52] U.S. Cl. ........................................................ 371/22.3
[58] Field of Search .................................. 371/22.3, 22.1, 371/22.5, 27; 324/158.1; 395/183.06

[56] References Cited

U.S. PATENT DOCUMENTS 5,270,642  12/1993  Parker ................................... 371/22.3
5,513,188   4/1996  Parker et al. ........................ 371/22.3

*Primary Examiner*—Vincent P. Canney
*Attorney, Agent, or Firm*—Leonard A. Alkov; Wanda K. Denson-Low

[57] ABSTRACT

A boundary scan cell including a three-state output buffer, a test data scan flip-flop for providing an input to the three-state buffer, a control data scan flip-flop for receiving a serial control data input, independent clock signals for independently clocking the test data scan flip-flop and the control data scan flip-flop, and control circuitry for controllably providing the output of the control data scan flip-flop to the three-state output driver such that the enabled state of the three-state output buffer is controlled by the output of the control data scan flip-flop, whereby the enabled state of the three-state output driver is controlled independently of the test data in the test data scan flip-flop.

4 Claims, 2 Drawing Sheets

METHOD OF APPLYING BOUNDARY TEST PATTERNS

BACKGROUND OF THE INVENTION

The subject invention is directed generally to boundary scan testing, and is directed more particularly to boundary scan testing wherein boundary test patterns are applied in such a manner that the output signals at the outputs of a digital device participating in boundary scan testing transition one output signal at a time.

Boundary scan testing is commonly utilized to test the interconnections between digital devices that comprise a system, where the interconnected devices can include integrated circuits, application specific integrated circuits (ASICs), hybrids, and circuit boards, for example. For boundary scan test capability, a device includes scan circuits that are capable of isolating device input circuits and output circuits from the interior logic of the device and directly accessing such input circuits and output circuits, which allows special interconnection test patterns to be applied and observed without interference from the interior logic functions.

Boundary scan test capability is commonly implemented with boundary scan cells respectively associated with those input circuits and output circuits for which boundary scan testing capability is being provided, with each boundary scan cell containing a scan flip-flop. The scan flip-flops are arranged into a register chain that is capable of operation in serial and parallel modes, so that test patterns can be loaded serially, applied in parallel, and test results can be read out serially.

For testing, special interconnection test patterns are serially loaded into scan flip-flops for device output circuits. After a test pattern is loaded, the output scan cells containing the test pattern are switched to drive their associated output circuits in accordance with the test pattern. Subsequently, the signals observed on input circuits are stored in associated input scan flip-flops. The stored inputs are then serially read out to evaluate the test. A further test pattern can be serially loaded into output scan flip-flops while stored inputs are being serially read out.

Boundary scan test patterns are basically designed to achieve the following:

1. To drive each device output to the high state and to the low state at different times. Proper reception at the appropriate inputs verifies continuity.

2. To drive each device output to the state opposite that of all other outputs, for both the low state and the high state. A short circuit between two or more outputs will be indicated by contention between the shorted drivers.

The paper "INTERCONNECT TESTING WITH BOUNDARY SCAN," Wagner, IEEE Proc. 1987 International Test Conference, pages 52–57, generally describes the application and implementation of boundary scan testing, and test patterns that allow for efficient boundary scan testing.

A consideration with known boundary scan circuitry is that up to half of the device outputs participating in a boundary scan test may change pursuant to application of each test pattern, which often causes problems since devices are often not designed to accommodate a large number of simultaneously switching outputs due to factors including induced power and ground noise. A present approach to the problem of simultaneous switching of a large number of device outputs is to successively test subsets of the device output circuits, wherein each subset maintains the number of simultaneously switching outputs to be no greater than the largest number of simultaneously switching outputs that the device was designed to accommodate in actual operation. By independently exercising subsets of the device outputs, the boundary test pattern set for each device becomes unique to such device, which prevents the use of a single, common test pattern set for all devices. Alternatively, the number of power/ground pins could be increased for device, which is undesirable because of limitations on the number of input circuits and output circuits.

SUMMARY OF THE INVENTION

It would therefore be an advantage to provide for boundary scan testing wherein changes of the logical states of device output pins pursuant to application of a test pattern occur one output pin at a time.

The foregoing and other advantages are provided by the invention in a boundary scan cell that includes a three-state output buffer, a test data scan flip-flop for providing an input to the three-state buffer, a test data multiplexer responsive to the output of the test data scan flip-flop and a serial test data input for providing an input to the test data scan flip-flop, a control data scan flip-flop for receiving a serial control data input, independent clock signals for independently clocking the test data scan flip-flop and the control data scan flip-flop, and control circuitry for controllably providing the output of the control data scan flip-flop to the three-state output driver such that the enabled state of the three-state output buffer is controlled by the output of the control data scan flip-flop, whereby the enabled state of the three-state output driver is controlled independently of the test data in the test data scan flip-flop.

BRIEF DESCRIPTION OF THE DRAWINGS

The advantages and features of the disclosed invention will readily be appreciated by persons skilled in the art from the following detailed description when read in conjunction with the drawing wherein.

DETAILED DESCRIPTION OF THE DISCLOSURE

Figure 1:
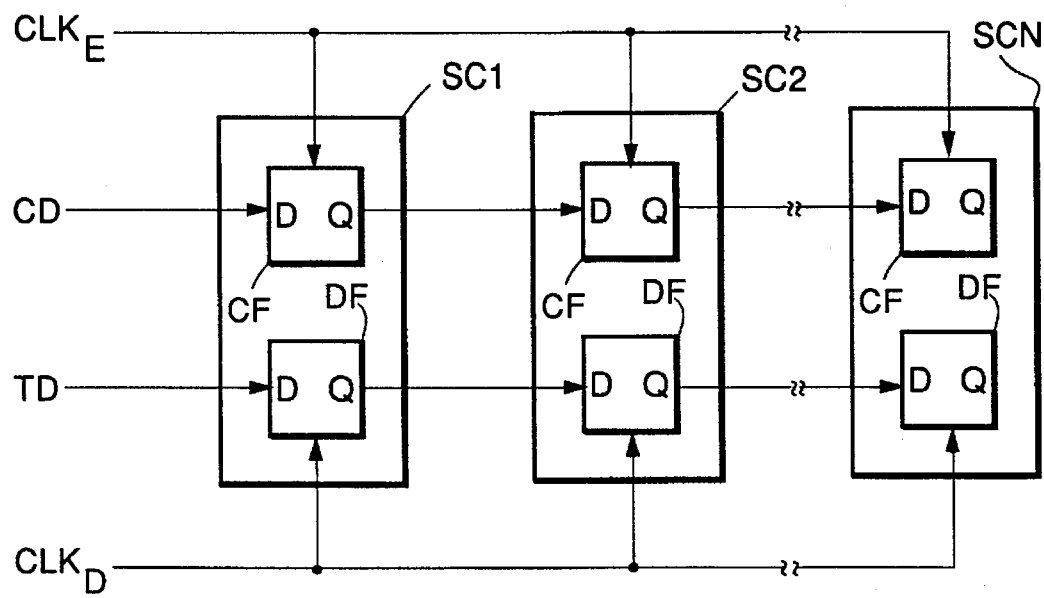
FIG. 1 is a simplified block diagram of a boundary scan chain in accordance with the invention.

In the following detailed description and in the several figures of the drawing, like elements are identified with like reference numerals.

The subject invention is directed to boundary scan testing of a digital device having three-state output drivers wherein a test pattern is scanned into scan flip-flops while the three-state output drivers are in the high impedance state, and wherein the three-state output drivers are enabled one output driver at a time. In accordance with the invention, the three-state output drivers and scan flip-flops of digital device are implemented in boundary scan cells each including a scan data flip-flop and an output control flip-flop that are independently clocked, as schematically depicted in FIG. 1 which sets forth a simplified block diagram of a chain of scan cells in accordance with the invention. The scan chain includes a plurality of scan cells SC1 through SCN each of which provides a three-state output of the device in which the scan chain is implemented. Each of the scan cells SC1 through SCN includes an enable control data scan flip-flop CF that is clocked by an enable control clock signal $CLK_e$ and a test data scan flip-flop DF that is clocked by a data control clock signal $CLK_d$. The enable control data scan flip-flops CF are controlled to receive serial enable control data CD which controls the three-state output drivers of the cells; and the test data scan flip-flops DF are controlled to receive serial test data TD which are provided to the inputs of the three-state output drivers for testing.

Figure 2:
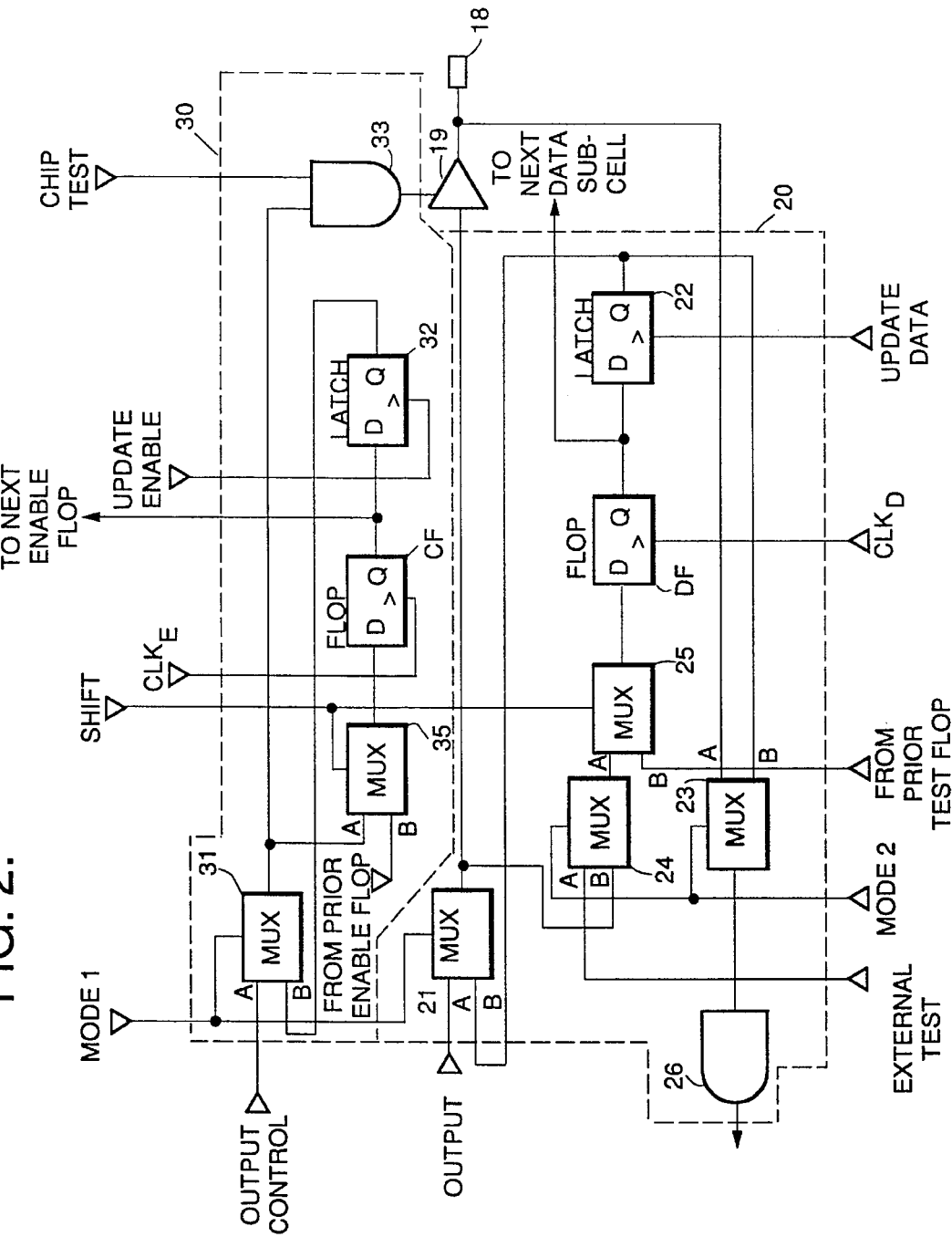
FIG. 2 is a schematic diagram of an illustrative example of a boundary scan cell that can be utilized in the boundary scan chain of FIG. 1.

Referring now to FIG. 2, set forth therein is a schematic diagram of a scan cell in accordance with the invention which includes a data subcell 20, an enable control subcell 30, and a three-state output driver 19. The data subcell 20 includes a test mode control multiplexer 21 that receives as its A and B inputs an OUTPUT signal from the interior logic of the device in which the scan cell is implemented and the output of a test data hold latch 22 which is controlled by an UPDATE DATA signal to be transparent when the UPDATE DATA signal is a 1 and to be latched when the UPDATE DATA signal is a 0. The mode control multiplexer 21 selects its output to be a replica of the A input or a replica of the B input pursuant to the state of a MODE1 control signal. By way of illustrative example, in each of the multiplexers in the scan cell of FIG. 2 the A input is selected when the control signal applied to the multiplexer is a 0, while the B input is selected when the control signal is a 1. The output of the test mode control multiplexer 21 is provided as the input to the three-state output driver 19. The output of the three-state output driver is provided to an I/O pin 18.

The data subcell 20 further includes a multiplexer 23 whose A and B inputs are provided by the output of the test data hold latch 22 and the output of the three-state output driver 19. The multiplexer 23 is controlled by a MODE2 control signal, and its output is provided as the A input to a multiplexer 24 which is controlled by the MODE2 control signal and whose B input is provided by the output of the test mode control multiplexer 21. The output of the multiplexer 24 is provided as the A input to a test data shift control multiplexer 25 which is controlled by a SHIFT control signal and whose output is provided to a test data scan flip-flop DF. The B input to the test data shift control multiplexer 25 is provided by the Q output of a test data scan flip-flop prior in sequence in the scan chain in which the test data scan flip-flop DF is implemented or by the external serial input to the scan chain. The Q output of the test data scan flip-flop DF is provided to the test data shift control multiplexer of the data subcell next in sequence in the scan chain or to the serial output of the scan chain, and is further provided to the data hold latch 22. The data subcell 20 also includes a two-input AND gate 26 whose inputs are provided by the output of the multiplexer 23 an EXTERNAL TEST signal. The output of the two-input AND gate 26 is provided as an input to the interior logic of the device in which the scan cell of FIG. 2 is implemented.

The control enable subcell 30 includes the test mode control multiplexer 31 which is controlled by the MODE1 signal and receives as its A and B inputs an OUTPUT CONTROL signal and the output of an enable control latch 32 which is controlled by an UPDATE ENABLE signal to be transparent when the UPDATE ENABLE signal is a 1, and to be latched when the UPDATE ENABLE signal is a 0. The output of the test mode control multiplexer 31 is provided as one input to a two-input AND gate 33 whose other output is controlled by a TEST signal. The output of the AND gate 33 is provided as the control input to the three-state output driver 19 and thus controls whether the three-state output driver 19 is enabled or disabled. In accordance with conventional techniques, the three-state driver 19 is in the high impedance state when disabled, while its output is a replica of the logical level at its input when enabled. By way of example, the three-state driver is disabled when its control input is 0, and is enabled when its control input is 1.

The enable control subcell 30 further includes an enable control data shift control multiplexer 35 which is controlled by the SHIFT control signal and whose output is provided to an enable control data scan flip-flop CF. The B input to the enable control data shift control multiplexer 25 is provided by the Q output of an enable control data scan flip-flop prior in sequence in the scan chain in which the enable control data scan flip-flop CF is implemented or by the external serial input to the scan chain. The Q output of the enable control data scan flip-flop is provided to the enable control data scan flip-flop next in sequence in the scan chain or to the serial output of the scan chain, and is further provided to the enable control data hold latch 32.

A scan chain that is comprised of a plurality of scan cells in accordance with FIG. 2 is utilized to advantageously perform various boundary scan tests, examples of which are described below.

For example, a scan chain in accordance with the invention can implement boundary scan testing wherein the three-state output drivers are enabled to change state one driver at a time pursuant to a test pattern that has been scanned into the test data scan flip-flops. This "one change at a time" testing is accomplished as follows:

1. The control data latch and the test data latch are controlled to be transparent.

2. The MODE1 signal is set to 1 such that the mode control multiplexers 21, 31 select their B inputs.

3. The MODE2 signal is set to 1 such that the enable control data scan flip-flops operate in serial mode and the test data scan flip-flops operate in serial mode.

4. The CHIP TEST signal is set to 0.

5. The enable control data scan flip-flops are clocked to serially shift enable control data comprising all 0's into the control data scan flip-flops, and the test data scan flip-flops are not clocked.

6. The CHIP TEST signal is set to 1, so that the enable control data in the enable control data scan flip-flops can control the three-state drivers.

7. The test data scan flip-flops are clocked to serially shift test data into the test data scan flip-flops and to scan out test results which will be present only after the first test pattern has been serially scanned, while the control data scan flip-flops are not clocked. This causes the test data to be stored in the test data scan flip-flops while the three-state output drivers are in the high impedance state.

8. The enable control data scan flip-flops are clocked to serially shift enable control data comprising all 1's into the control data scan flip-flops while the test data scan flip-flops are not clocked. This causes the three-state output drivers to be enabled one output driver at a time at an active clock transition, whereby an enabled driver provides an output that is a replica of the test data bit stored in the corresponding test data scan flip-flop, to the extent the driver is operating properly.

9. The MODE2 signal is set to 0 and the test data scan flip-flops are clocked with one active clock transition to sample the outputs of the three-state drivers into the corresponding test data scan flip-flops.

10. The MODE2 signal is set to 1, and steps 4–9 are repeated until all test patterns have been scanned in and the corresponding test results have been scanned out.

Another example of a boundary scan test that can be performed with a scan chain that is comprised of scan cells in accordance with FIG. 2 is a speed test for verifying that each three-state output buffer in the chain is capable to transitioning to from one logical state to another in a clock period. The speed test can be accomplished as follows:

1. The CHIP TEST signal is set to 1.

2. The MODE1 signal is set to 1 such that the mode control multiplexers 21, 31 select their B inputs.

3. The MODE2 signal is set to 1 such that the control data scan flip-flops operate in serial mode and the test data scan flip-flops operate in serial mode.

4. Enable control data comprising all 1's and test data comprising all 1's are respectively scanned concurrently into the control data scan chain and the test data scan chain. This causes all three-state drivers to be enabled and to have outputs that are all 1's.

5. The enable control data latch and the test data latch are set to be transparent.

6. The MODE2 signal is set to 1, and a 0 is shifted into the test data scan chain pursuant to an active clock transition. The control data scan chain is not clocked.

7. The MODE2 signal is set to 0 so that the scan flip-flop chains operate in parallel mode, and the outputs of the three-state drivers are sampled into the test data scan flip-flops pursuant to an active clock transition that is one clock period subsequent to active clock transition of the shift in step 6.

8. The MODE2 signal is set to 1 so that the scan flip-flop chains operate in serial mode, and a 1 is scanned into the test data scan chain pursuant to an active clock transition. The control data scan chain is not clocked.

9. The MODE2 signal is set to 0 so that the scan flip-flop chains operate in parallel mode, and the outputs of the three-state drivers are sampled into the test data scan flip-flops pursuant to an active clock transition that is one clock period following the active clock transition for the shift in step 8.

10. Steps 8 and 9 are repeated as would be required to propagate the 0 and the immediately following 1 to the end of the scan chain. In other words, steps 8 and 9 are repeated in such a manner that the 0 and the immediately following 1 will propagate to the end of the scan chain if all of the three-state drivers in the scan chain operate faster than the speed defined by the clock period between the active clock transition in step 8 and the active clock transition in step 9.

In the foregoing procedure, the 0 will propagate through the test data scan chain only if each of the three-state buffers transitions from a 1 to a 0 within a clock period following the active clock transition by which a 0 was shifted into the test data scan flip-flop for such three-state buffer. Similarly, a 1 immediately following the 0 will propagate through the test data scan chain only if each of the three-state buffers transitions from a 0 to a 1 within a clock period following the active clock transition by which the 1 following the 0 was shifted into the test data scan flip-flop for such three state buffer. More particularly, if a three-state driver transitions from a 1 to a 0 within a clock period following the active clock transition that shifted a 0 into its corresponding test data scan flip-flop, a 0 will be stored in the corresponding test data scan flip-flop and shifted to the next in chain test data scan flip-flop on the next shift. If a three-state driver does not transition from a 1 to a 0 within a clock period following the active clock transition that shifted a 0 into its corresponding test data scan flip-flop, a 1 will be stored in the corresponding test data scan flip-flop and shifted to the next in chain test data scan flip-flop. Thus, if all three-state output drivers operate faster than the speed defined by the clock period, a single 0 will be scanned out at the end of the speed test. If any one of the three-state output drivers is too slow, the data scanned out will be all 1's since the 0 was unable to propagate through one of the three-state output drivers. Similarly, if any 0 to 1 transition is too slow, the scan output will include an additional 0 after the expected 0.

The scan cell of FIG. 2 is a bidirectional since the cell is capable for providing a device output on the I/O pin 18, as well as receiving a device input on the I/O pin 18. The invention also contemplates an output scan cell wherein the AND gate 26 is omitted, such that cell cannot accept an input.

While the foregoing has disclosed separately controlled latches for the enable control data and the test data, it should be appreciated that the latches can be identically controlled. Moreover, depending upon the desired test capabilities, the latches can be omitted, which limits test capability to those tests that do not require latching the outputs of the enable control scan flip-flop and the test data scan flip-flop.

The foregoing has been a disclosure of a boundary scan cell that advantageously provides for more efficient and comprehensive boundary scan testing.

Although the foregoing has been a description and illustration of specific embodiments of the invention, various modifications and changes thereto can be made by persons skilled in the art without departing from the scope and spirit of the invention as defined by the following claims.

What is claimed is:

1. A boundary scan cell comprising:

a three-state output buffer;

a test data scan flip-flop for providing an input to said three-state buffer;

test data multiplexing means responsive to the output of said test data scan flip-flop and a serial test data input for providing an input to said test data scan flip-flop;

a control data scan flip-flop for receiving a serial control data input;

clocking means for clocking said test data scan flip-flop and said control data scan flip-flop independently of each other; and control means for controllably providing the output of said control data scan flip-flop to said three-state output driver such that the enabled state of said three-state output buffer is controlled by the output of said control data scan flip-flop;

whereby the enabled state of said three-state output driver is controlled independently of the test data in the test data scan flip-flop.

2. A boundary scan cell comprising:

a three-state output buffer;

a test data scan flip-flop;

a test data latch responsive said test data scan flip-flop for providing an input to said three-state buffer;

test data multiplexing means responsive to the output of said test data latch and a serial test data input for providing an input to said test data scan flip-flop;

a control data scan flip-flop for receiving a serial test data input;

a control data latch responsive said test data scan flip-flop;

clocking means for clocking said test data scan flip-flop and said control data scan flip-flop independently of each other; and control means for controllably providing the output of control data latch to said three-state output driver such that the enabled state of said three-state output buffer is controlled by the output of said control data scan flip-flop;

whereby the enabled state of said three-state output driver is controlled independently of the test data in the test data scan flip-flop.

3. A method for boundary scan testing a device having a chain of scan cells respectively associated with outputs of the device, wherein each scan cell includes a control data scan flip-flop, a test data scan flip-flop, and a three-state output driver enabled state is controlled by the contents of the control data scan flip-flop and whose input is provided by the state of the contents of the test data scan flip-flop, the method comprising the steps of:

scanning control data of a first state into the control data scan flip-flops to disable the three-state output drivers;

scanning test data into the test data scan flip-flops while the three-state drivers are in the disabled state; and scanning control data of a second state into the control data scan flip-flops to enable the three-state output drivers one at a time.

4. A method for boundary scan testing a device having a chain of scan cells respectively associated with outputs of the device, wherein each scan cell includes a control data scan flip-flop, a test data scan flip-flop, and a three-state output driver enabled state is controlled by the contents of the control data scan flip-flop and whose input is provided by the state of the contents of the test data scan flip-flop, and wherein the control data scan flip-flops comprise a control data scan chain and the test data scan flip-flops comprise a test data scan chain, the method comprising the steps of:

(A) serially scanning into the control data scan chain control data bits of a first logical state to enable the three-state output drivers;

(B) serially scanning into the test data scan chain test data bits of the first logical state such that the outputs of the three-state output drivers are of the first logical state;

(C) scanning into the test data scan chain a data bit of a second logical state pursuant to a clock cycle;

(D) sampling the outputs of the three-state output drivers into the test data scan chain pursuant to a clock cycle following the clock cycle of step (C);

(E) scanning into the test data scan chain a data bit of the first logical state pursuant to a clock cycle;

(F) sampling the outputs of the three-state output drivers into the test data scan chain pursuant to a clock cycle following the clock cycle of step (E); and (G) repeating steps (E) and (F) as would be required to propagate the data bit of the second logical state and the immediately following data bit of the first logical state to the end of the test data scan chain.

* * * * *